United States Patent
Felzenshtein et al.

(10) Patent No.: US 9,160,932 B2
(45) Date of Patent: *Oct. 13, 2015

(54) FAST GATING PHOTOSURFACE

(71) Applicant: Microsoft Corporation, Redmond, WA (US)

(72) Inventors: Shlomo Felzenshtein, Nesher (IL); Giora Yahav, Haifa (IL); Eli Larry, Beit She'an (IL)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/269,166

(22) Filed: May 4, 2014

(65) Prior Publication Data

US 2014/0240462 A1 Aug. 28, 2014

Related U.S. Application Data

(63) Continuation of application No. 12/699,074, filed on Feb. 3, 2010, now Pat. No. 8,717,469.

(51) Int. Cl.
*H04N 5/335* (2011.01)
*H04N 5/232* (2006.01)
(Continued)

(52) U.S. Cl.
CPC .............. *H04N 5/2353* (2013.01); *G01C 3/08* (2013.01); *H01L 27/146* (2013.01); *H01L 27/148* (2013.01); *H04N 5/335* (2013.01);
(Continued)

(58) Field of Classification Search
CPC ........ G01S 17/06; G01S 17/08; H04N 5/2353

USPC ............ 348/135, 207.99, 345, 348, 272, 281, 348/282, 283, 294, 295, 296, 297, 298, 299, 348/303, 304, 307, 308, 309, 310, 311, 312, 348/313, 314, 316, 317, 319, 320, 321, 322, 348/323

See application file for complete search history.

(56) References Cited

U.S. PATENT DOCUMENTS 5,086,342 A    2/1992  Spies et al.
6,982,761 B1 *  1/2006  Tani .............................. 348/348
(Continued)

FOREIGN PATENT DOCUMENTS

CN        1241299 A      1/2000

OTHER PUBLICATIONS

"First Office Action" Issued in Chinese Patent Application No. 201110039456.5, Mailed Date: Feb. 1, 2013, 11 Pages.
(Continued)

*Primary Examiner* — Twyler Haskins
*Assistant Examiner* — Peter Chon
(74) *Attorney, Agent, or Firm* — Gregg Wisdom; Judy Yee; Micky Minhas

(57) ABSTRACT

An embodiment of the invention provides a camera comprising a photosurface having a substrate comprising photopixels and associated storage pixels and a controller that controls the photosurface to image a scene by maintaining a bias between the photopixels and their respective storage pixels at all times during an exposure period of the photosurface so that photocharge, substantially upon its generation in a photopixel by light from the scene incident on the photopixel moves towards the photopixel's storage pixel.

12 Claims, 8 Drawing Sheets

(51) Int. Cl.
*H04N 5/235* (2006.01)
*G01C 3/08* (2006.01)
*H01L 27/146* (2006.01)
*H01L 27/148* (2006.01)
*H04N 13/02* (2006.01)
*H04N 5/351* (2011.01)

(52) U.S. Cl.
CPC .............. *H04N 5/351* (2013.01); *H04N 13/02* (2013.01); *H04N 13/0203* (2013.01); *H04N 13/0296* (2013.01)

(56) References Cited

U.S. PATENT DOCUMENTS

| | | | |
|---|---|---|---|
| 7,224,384 B1 | 5/2007 | Iddan et al. | |
| 7,388,611 B2 * | 6/2008 | Tsukamoto | 348/294 |
| 7,548,268 B2 * | 6/2009 | Hamada et al. | 348/349 |
| 7,759,624 B2 * | 7/2010 | Tachino et al. | 250/208.1 |
| 8,717,469 B2 * | 5/2014 | Felzenshtein et al. | 348/294 |
| 2005/0179144 A1 * | 8/2005 | Hori | 257/E27.151 |
| 2010/0085455 A1 * | 4/2010 | Goto | 348/296 |

OTHER PUBLICATIONS

"First Office Action" Issued in Chinese Patent Application No. 201110039456.5, Mailed Date: Sep. 17, 2013, 10 Pages.

"Second Office Action" Issued in Chinese Patent Application No. 201110039456.5, Mailed Date: Apr. 23, 2014, 10 Pages.

* cited by examiner

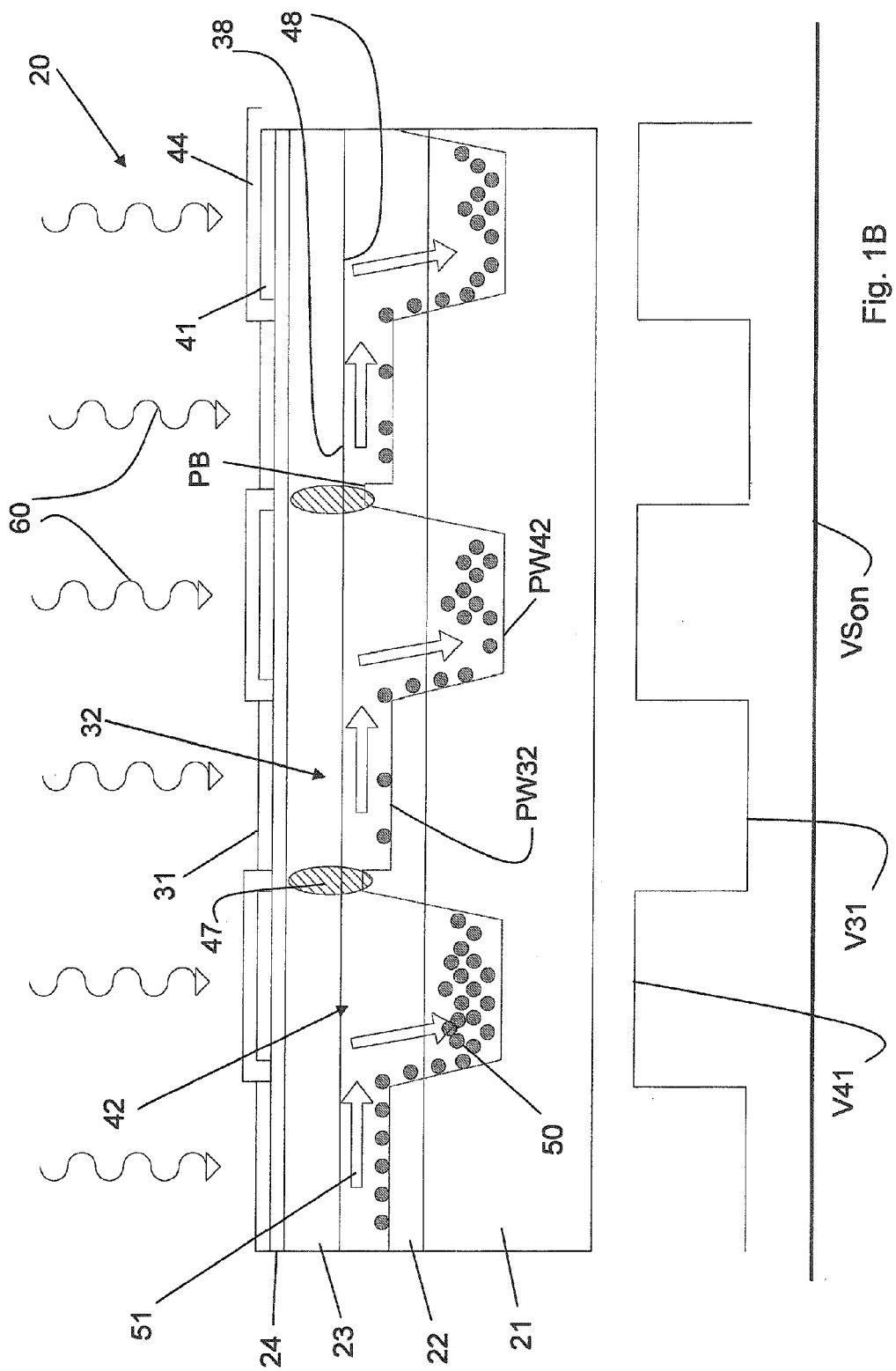

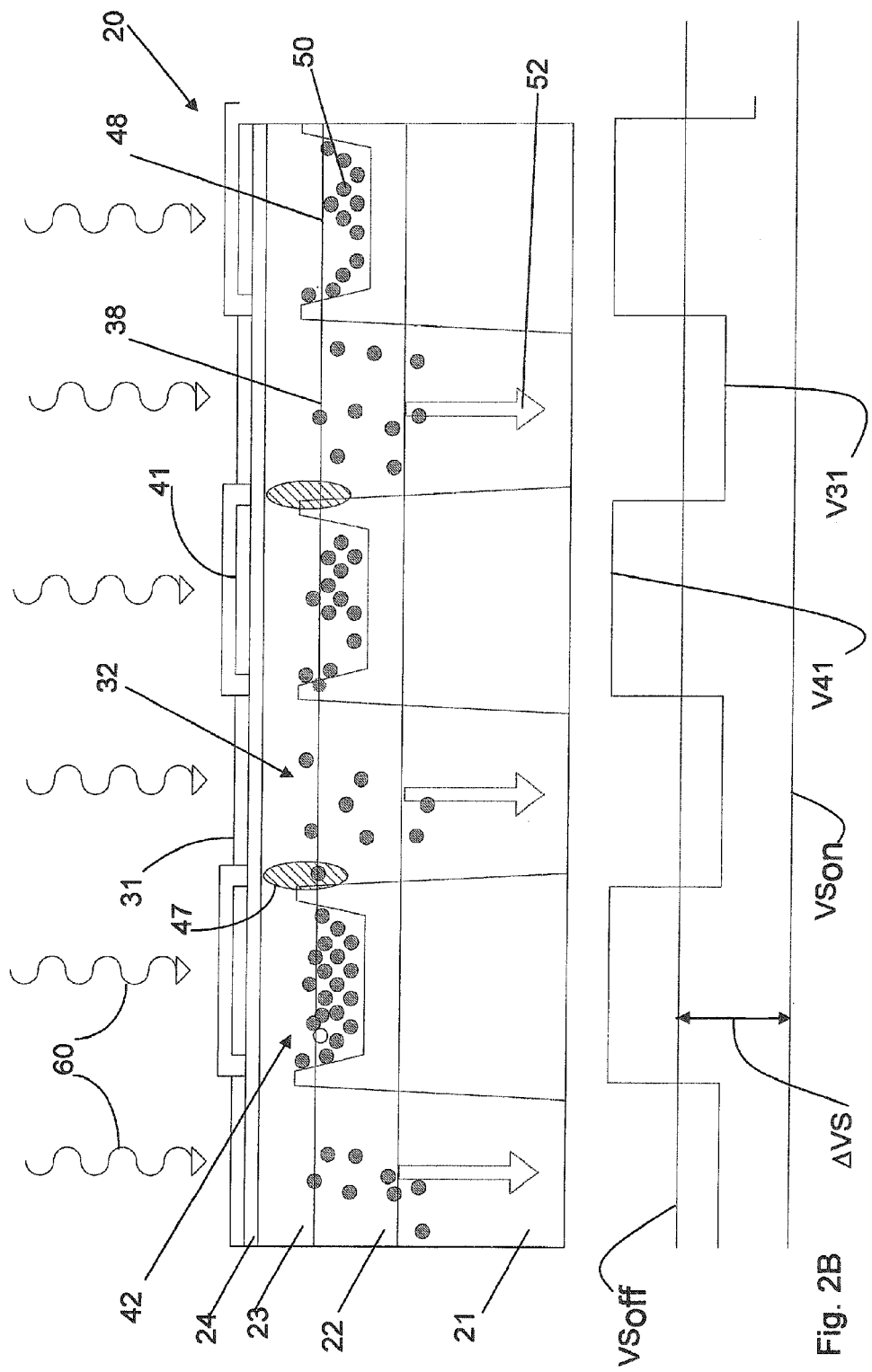

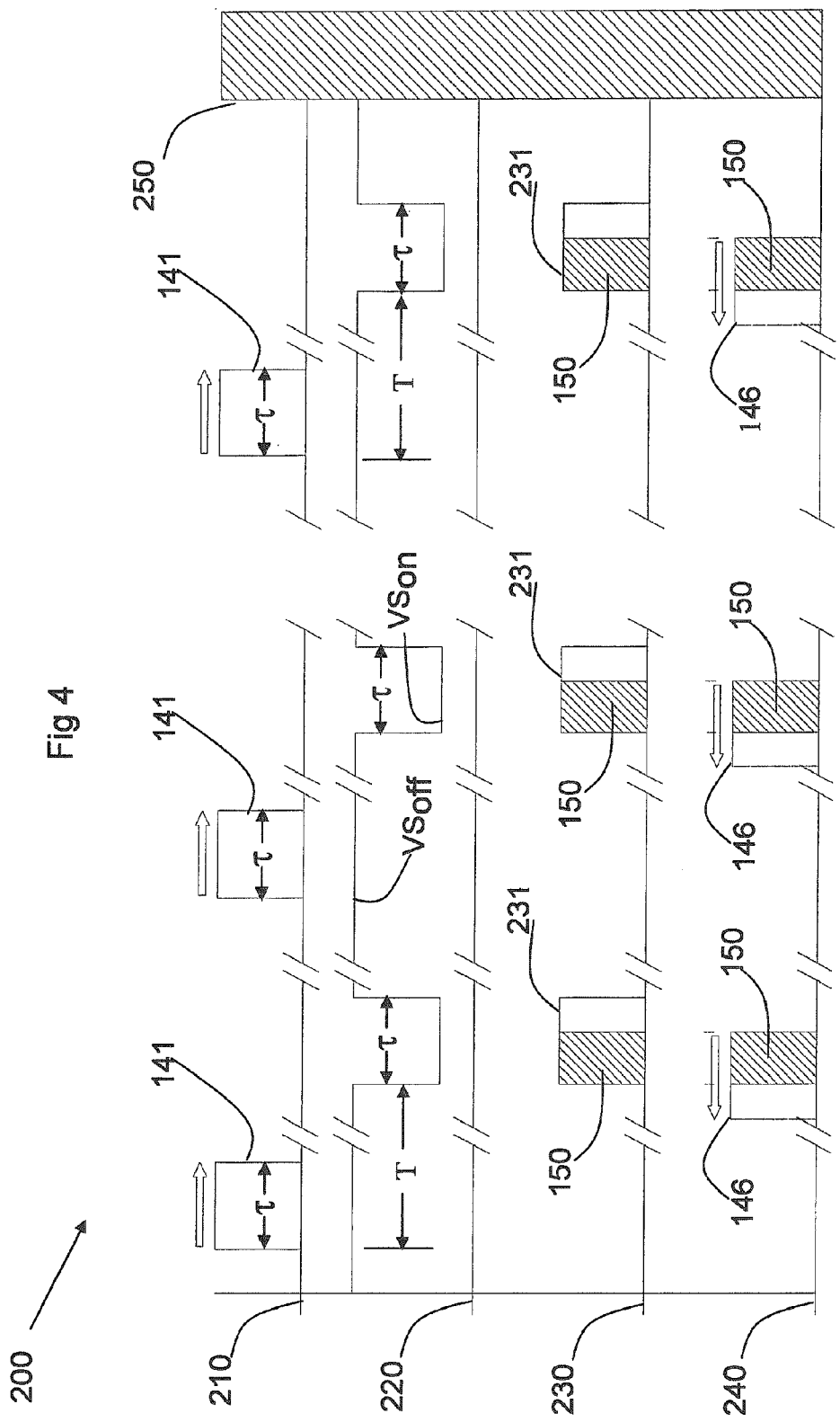

FAST GATING PHOTOSURFACE

RELATED APPLICATIONS

The current application is a continuation application of U.S. application Ser. No. 12/699,074 filed Feb. 3, 2010, which is incorporated herein by reference.

TECHNICAL FIELD

Embodiments of the invention relate to photosensitive surfaces and methods of gating such surfaces.

BACKGROUND

Various types of cameras that image a scene to provide distances to features in the scene and thereby capture three dimensions for the features, and for the scene, are well known in the art. Such cameras, often referred to as three-dimensional (3D) cameras include stereoscopic, triangulation, and time of flight, 3D cameras.

Gated, time of flight 3D cameras comprise a photosensitive surface, hereinafter referred to as a "photosurface" and a shutter for shuttering the camera open and closed. Typically a photosurface comprises a photosensitive surface of a semiconductor device such as Charge Coupled Device (CCD) or a Complementary Metal-Oxide-Silicon (CMOS) light sensitive device, having light sensitive pixels formed on a suitable substrate. A shutter used to shutter the camera open or closed may comprise, by way of example, a gated image intensifier, or a solid state electro-optical or acousto-optical modulator.

Shuttering a camera open or closed is also commonly referred to as "gating" a camera open or closed (hence the name "gated time of flight 3D camera") and refers to respectively enabling or preventing registration by the camera's photosurface of light collected by the camera. Gating a camera open or closed is also referred to herein as respectively gating open or gating closed its photosurface. Terms "gating on" and "gating off" a camera or a camera's photosurface are also used herein and respectively mean gating open and gating closed the photosurface or camera. "Shuttering" or "gating" a photosurface or camera without modification by the adverb "open" or "closed" refers to an operation of gating on and/or gating off the photosurface or camera.

A period of time during which a camera is gated open is an exposure period during which the camera's photosurface registers light that the camera collects and directs to the camera's photosurface. A photosurface registers light by accumulating and storing charge, hereinafter "photocharge", which the light generates in the photosurface's pixels. The light generates photocharge by creating electron-hole pairs in the photosurface pixels. Depending on a doping configuration of the photosurface, the accumulated and stored photocharge may be either electrons or holes from the electron-hole pairs.

To image a scene and determine distances from the camera to features in the scene, the scene can be illuminated, for example with a train of light pulses radiated from an appropriate light source. Typically, the radiated light pulses are near infrared (NIR) light pulses. The camera is gated open for an exposure period for each radiated light pulse in the train, following a predetermined delay from a time at which the light pulse is radiated. For a feature imaged on a pixel in the photosurface, light reflected by the feature from each radiated light pulse is registered on a pixel imaging the feature if the reflected light reaches the camera during the exposure period following the light pulse.

Following a last light pulse in the light pulse train, charges accumulated in the pixels of the photosurface during the exposure periods are sensed and converted to voltages. The set of voltages representing the accumulated charges is referred to as a "frame" of the photosurface. Since the time elapsed between radiating a light pulse and the exposure period that follows it is known, a time it took imaged light that is registered by the pixels to travel from the light source to the reflecting features and back to the camera is known. Light registered by the pixels, the speed of light and the time elapsed is used to determine distances to features in the scene.

In some gated 3D cameras, only whether or not light is registered on a pixel of the 3D camera's photosurface, and the time elapsed between light pulses and exposure periods are used to determine distance from the 3D camera to a feature in the scene imaged on the pixel. Because it is unknown when within an exposure period light reflected from a light pulse by the feature is registered by the gated 3D camera's photosurface, accuracy of distance to the feature is typically determined to no better than a distance equal to the speed of light times half a sum of the exposure period duration and light pulse width.

In other gated 3D cameras, an amount of light registered by the pixel during the exposure periods is also used to determine the distance to the feature. The amount of registered light is used to indicate when during the exposure periods light from the feature is registered, and thereby to improve accuracy of distance measurements to the feature. For a given and light pulse width and a given exposure period duration, accuracy of distance measurements provided by 3D gated cameras that use amounts of registered light, may be substantially improved relative to that provided by 3D gated cameras that do not use amounts of registered light. Accuracy of distance measurements resulting from use of amounts of registered light may be less than about one tenth of a distance equal to the speed of light times half a sum of the pulse width and duration of the exposure period. In gated 3D cameras in which an amount of light is used to determine distances to the imaged feature, the amount of light registered on the pixel is generally corrected for reflectivity of the feature, dark current and background light.

Accuracy of measurements made with a gated 3D camera is a function of, among other variables, rise and fall times, jitter and pulse widths of the light pulses, and how fast the camera's shutter can gate the camera open and closed. A shutter that is sufficiently fast to gate a photosurface of a 3D camera so that the camera provides distance measurements having a required accuracy is referred to as a fast shutter. Typically a fast shutter that is used to shutter a gated 3D camera is separate from, and external to the camera's photosurface. Such an external fast shutter, such as by way of example, a gated image intensifier noted above, may be capable of being switched between optically blocking and unblocking states in less than a nanosecond (ns) or a few nanoseconds.

It does not appear to be advantageous to gate a 3D gated camera by electronically turning on and turning off, hereinafter also referred to as "electronically shuttering", the camera's photosurface. Even relatively fast conventional, electronically shuttered interline CCDs have shuttering speeds that are generally in excess of about 100 nanoseconds. In addition, a processing time equal to about a microsecond is typically required to acquire a frame of the CCD's pixels. As a result of the processing time, the CCD cannot be electronically shuttered on and off at frequencies greater than or equal to about a megacycle. Because of shuttering speeds in excess of about 100 nanoseconds and the limits on gating frequency, conventionally, electronically shuttered interline CCDs are generally too slow for use in a gated 3D camera to determine distances without an external, fast shutter.

It is noted that turning or shuttering on, and turning or shuttering off a photosurface refer respectively to initiating and ending an exposure period of the photosurface and not necessarily to initiating or terminating any other function and/or process of the photosurface. For example, turning on and turning off a photosurface does not necessarily refer to initiating or terminating transfer of photocharge to a readout amplifier.

To illustrate constraints on shuttering speeds for 3D gated cameras, it is noted that light sources used to provide light pulses for a gated 3D camera may not provide sufficient energy in a single light pulse so that enough light is reflected by features in the scene from the light pulse and back to the camera to provide satisfactory distance measurements to the features. As a result, as noted above, to acquire distance measurements, the scene is exposed to a train of many light pulses. The camera is gated open and closed for each light pulse, and light from the light pulse is registered in pixels of the camera. Intensity of the light pulses, and their number in the light pulse train, are determined so that an amount of reflected light registered from all the light pulses in the train is sufficient to provide acceptable distance measurements to features in the scene. As many as a thousand light pulses might be required in a light pulse train so that an amount of reflected light that reaches the camera from the scene is sufficient to provide acceptable distance measurements. To reduce imaging time, and or possible image blur, to an acceptable level, the light pulse repetition rate, and corresponding repetition rate of exposure periods, may advantageously be as high as at least $10^7$ per second and consequently have a repetition period of about 100 ns or less. Furthermore, light pulse widths and durations of exposure periods may be equal to about 30 ns or less. Conventional electronic shuttering of CCDs is generally much too slow to provide these shuttering speeds and repetition rates.

SUMMARY

An embodiment of the invention provides a camera comprising a photosurface that is electronically turned on and off to respectively initiate and terminate an exposure period of the camera at a frequency sufficiently high so that the camera can be used to determine distances to a scene that it images without use of an external fast shutter. In an embodiment of the invention the photosurface comprises pixels formed on a substrate and the photosurface is turned on and turned off by controlling voltage to the substrate. In accordance with an embodiment of the invention the substrate pixels comprise light sensitive pixels, hereinafter referred to as "photopixels", in which light incident on the photosurface generates photocharge, and storage pixels, which are insensitive to light that generates photocharge in the photopixels. In accordance with an embodiment of the invention, the photosurface is controlled so that the storage pixels accumulate and store photocharge substantially upon its generation during an exposure period of the photosurface.

Optionally, the photosurface comprises a CMOS photosurface, also referred to simply as a "CMOS". Optionally, the photosurface comprises a CCD photosurface, also referred to as a "CCD". Optionally the CCD comprises an interline CCD.

There is therefore provided in accordance with an embodiment of the invention, a method of gating a photosurface comprising a substrate on which photopixels and associated storage pixels are formed. The method includes, applying a first voltage, hereinafter referred to as an "ON voltage" at a first time to the substrate to turn on the photosurface and initiate an exposure period of the photosurface; and applying a second voltage, hereinafter also referred to as an "OFF voltage" at a second time to the substrate to turn off the photosurface and end the exposure period.

The method optionally includes biasing the photopixels and associated storage pixels so that during the exposure period photocharge generated in the photopixels by incident light move from the photopixels to, and are accumulated in, the storage pixels substantially upon their generation.

In some embodiments of the invention, the exposure period is less than 100 ns. Optionally, the exposure period is less than 70 ns. Optionally, the exposure period is less than 35 ns. Optionally, the exposure period is less than 20 ns.

In some embodiments of the invention, a frame of the CCD is acquired following second time.

In some embodiments of the invention the method includes repeatedly turning on and turning off the photosurface for a plurality of exposure periods. Optionally, turning on and off the photosurface for the plurality of exposure periods comprises repeatedly turning on and turning off the photosurface at a repetition frequency greater than or equal to 2.5 MHz. Optionally, the repetition frequency is greater than or equal to 5 MHz. Optionally, the repetition frequency is greater than or equal to 10 MHz.

In some embodiments of the invention, a frame of the photosurface is acquired for the plurality of exposure periods only following termination of a last exposure period of the plurality of exposure periods.

There is further provided in accordance with an embodiment of the invention, a method of operating a photosurface comprising a substrate on which photopixels and associated storage pixels are formed. The method includes initiating an exposure period of the photosurface; and transferring photocharge generated in a photopixel by light incident on the photopixel, from the photopixel to an associated storage pixel prior to terminating the exposure period.

There is further provided in accordance with an embodiment of the invention, a camera that includes a photosurface having a substrate on which photopixels and associated storage pixels are formed and a controller that controls the photosurface in accordance with an embodiment of the invention to image a scene.

There is further provided in accordance with an embodiment of the invention, a 3D camera for providing distances to features in a scene. The camera comprises a light source that transmits a train of light pulses to illuminate the scene and a photosurface having photopixels that receive light reflected by the features from the light pulses and generate photocharge responsive thereto. The photosurface also has storage pixels that accumulate and store photocharge generated in the photopixels. A controller turns on and turns off the photosurface in accordance with an embodiment of the invention for each light pulse in the pulse train responsive to a time at which the light pulse is transmitted.

There is further provided in accordance with an embodiment of the invention, a method for determining distances to features in a scene. The method includes: transmitting a train of light pulses to illuminate the scene; turning on and turning off a photosurface in accordance with an embodiment of the invention to register light reflected from the light pulses by the features; and using the registered light to determine distances to the features. Optionally, the controller turns on and turns off the photosurface to provide a different exposure period of the photosurface for each light pulse in the pulse train responsive to a time at which the light pulse is transmitted.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

FIGS. 1A and 1B schematically show perspective and cross section views respectively of a portion of a highly simplified interline CCD photosurface when the CCD is turned on, in accordance with an embodiment of the invention;

FIGS. 2A and 2B schematically show perspective and cross section views respectively of the interline CCD shown in FIGS. 1A and 1B when the CCD is turned off, in accordance with an embodiment of the invention;

FIG. 4 shows a time line graph illustrating shuttering the gated 3D camera shown in FIG. 3, in accordance with an embodiment of the invention.

DETAILED DESCRIPTION

Figure 1A:
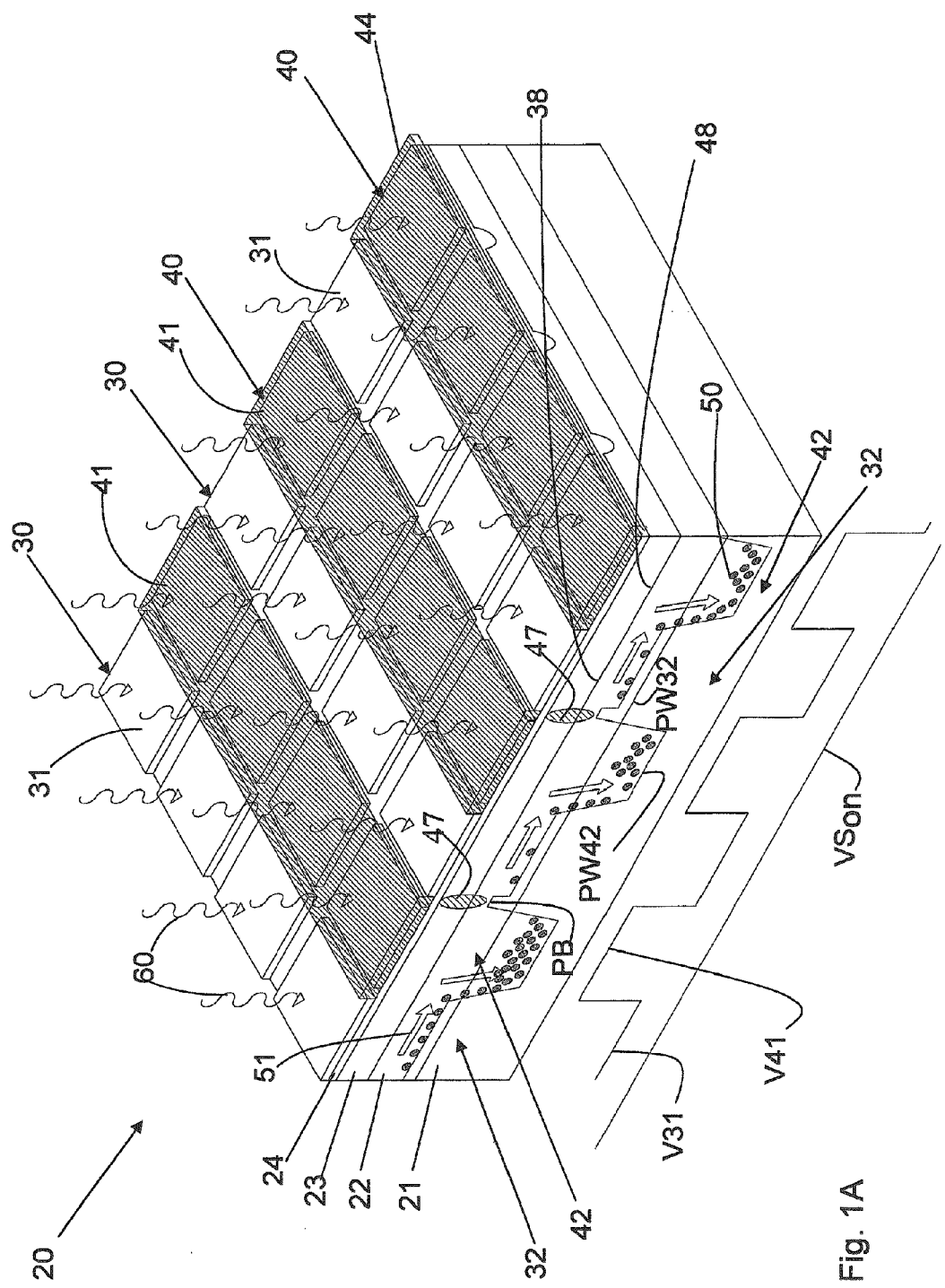

An aspect of an embodiment of the invention relates to providing a camera comprising a photosurface that is electronically turned on and turned off to initiate and terminate an exposure period of the photosurface to light from a scene imaged by the camera by controlling voltage to the photosurface's substrate. Optionally, the camera is a gated 3D camera and voltage to the photosurface substrate is controlled to turn on and turn off the photosurface sufficiently rapidly so that duration and repetition rates of the photosurface exposure periods enable the photosurface to be used in the camera to determine distances to the scene without an external shutter.

In an embodiment of the invention, the photosurface comprises an optionally different, light insensitive, storage pixel associated with each light sensitive pixel, hereinafter a "photopixel". Photocharges generated in a photopixel by light from the scene are transferred during and prior to terminating the exposure period from the photopixel to its associated storage pixel, where they are accumulated and stored. Optionally, photocharges generated in a photopixel are transferred continuously and rapidly to the photopixel's associated storage pixel during an exposure period as the photocharges are generated.

In accordance with an embodiment of the invention, following termination of an exposure period a frame of the photosurface is acquired by transferring charges stored in the storage pixels to amplifiers for conversion to voltage. In an embodiment of the invention, photocharge is accumulated and stored in storage pixels during a plurality of exposure periods, and a photosurface frame is acquired only following termination of a last of the plurality of exposure periods. In an embodiment of the invention, a train of light pulse illuminates the scene and exposure periods of the photosurface are timed responsive to timing of light pulses in the light pulse train.

In the following detailed description and associated figures, an interline CCD photosurface in accordance with an embodiment of the invention is described and schematically shown. A gated 3D camera in accordance with an embodiment of the invention that comprises the interline CCD photosurface is also described below, and schematically shown in figures associated with the description.

It is noted that whereas the detailed description and associated figures describe and show an interline CCD, practice of embodiments of the invention is not limited to interline CCD photosurfaces and cameras comprising interline CCD photosurfaces. For example, a photosurface that operates in accordance with an embodiment of the invention may have a non-linear structure different from that of an interline CCD and/or may be based on CMOS technology rather than CCD technology. The photosurface may, by way of example, comprise a hexagonal honeycomb structure of photopixels and storage pixels such as that described in PCT Application PCT/IB2009/053113 entitled "CMOS Photogate 3D Camera System Having Improved Charge Sensing Cell and Pixel Geometry" filed on Jul. 17, 2009.

The interline CCD photosurface comprises photopixels and storage pixels. The photopixels are sensitive to light and during an exposure period of the photosurface light incident on the photosurface generates photocharge in the photopixels. The storage pixels are insensitive to light, and light incident on the photosurface does not generate photocharge in the storage pixels. Storage pixels are used to accumulate and store photocharge created in the photopixels during an exposure period of the photosurface. Each storage pixel, and optionally each photopixel, comprises its own electrode. Functioning of the photopixels and storage pixels is controlled by controlling voltage to their respective electrodes.

In accordance with an embodiment of the invention, the photosurface is electronically turned on to initiate an exposure period by applying an ON voltage to the photosurface substrate and turned off to terminate the exposure period by applying an OFF voltage to the substrate. The photopixel and storage pixel electrodes are biased relative to each other so that when the ON voltage is applied to the interline CCD substrate, that is during an exposure period of the CCD, photocharge generated in a photopixel by light from a scene rapidly transfers to and is accumulated and stored in the photopixel's storage pixel. When the OFF voltage is applied to the substrate, photocharges generated in the photopixels by light from the scene drain to the substrate, and do not transfer from the photopixels and accumulate in the storage pixels. In an embodiment of the invention, the bias of the photopixel electrode relative to the storage pixel electrode is maintained substantially the same for exposure periods and non-exposure periods of the photosurface.

FIGS. 1A and 1B schematically show perspective and cross section views respectively of a portion of a highly simplified interline CCD photosurface 20 during an exposure period when the CCD photosurface is turned on by application of an ON voltage to the photosurface substrate, in accordance with an embodiment of the invention. In the figures, the photosurface is shown exposed to light, represented by wavy arrows 60, from a scene (not shown in FIGS. 1A and 1B).

The figures show CCD photosurface 20 comprising a linear array of photopixels and storage pixels characteristic of an interline CCD and accumulation in the storage pixels of electrons generated by light 60, in accordance with an embodiment of the invention. Interline CCD 20 is assumed, for convenience of presentation, to be configured with a doping architecture so that it registers electrons, hereinafter "photoelectrons", rather than holes from electron-hole pairs generated by incident light. In other embodiments, the CCD 20 can be provided with a doping architecture that registers holes from electron-hole pairs generated by incident light.

In an example embodiment, the CCD photosurface 20 comprises a silicon $p^{++}$ doped substrate 21, a p doped epitaxial layer 22, and an n doped layer 23. Layer 23 is covered with a silicon dioxide insulating layer 24. Columns 30 of conductive polysilicon electrodes 31 are formed over regions of the CCD photosurface that comprise photopixels 32 having np junctions 38. The numeral 30 is used to designate columns of photopixels 32 in addition to being used to designate columns of electrodes 31. Columns 40 of optionally polysilicon electrodes 41 are formed over regions of CCD 20 that comprise storage pixels 42 having np junctions 48. Columns 40 of storage pixels are optionally overlaid with a "masking" layer 44 of material, optionally a metal, which is opaque to light 60 and blocks exposure of the regions under storage pixel electrode 42 to light 60. In some embodiments, electrodes 41 are formed from a conducting material that is opaque to light 60 and the electrodes provide masking of storage pixels 42 in place of masking layer 44, or enhance masking provided by the masking layer. The numeral 40 is used to designate columns of storage pixels 42 in addition to being used to designate columns of electrodes 41. Rows (perpendicular to columns 30 and 40) of pixels are electrically isolated from each other by field oxide insulators 46. Each column 30 of photopixels 32 is associated with a column of storage pixels 42, optionally to its right and is electrically isolated from column 40 of storage pixels 42 to its left. Isolation of a column 30 of photopixels from the storage column to its left can for example be achieved by implanting a suitable dopant, or by forming a shallow trench isolation region, schematically represented by shaded regions 47, between the columns.

In perspective view FIG. 1A and cross section view 1B, CCD substrate 21 is electrified to an ON voltage $VS_{on}$ represented by a line labeled $VS_{on}$. In accordance with an embodiment of the invention, electrodes 31 located over photopixels 32 are electrified to a voltage V31, which is more positive than $VS_{on}$, and electrodes 41 over storage pixels 42 are electrified to a voltage V41, which is substantially more positive than voltage V31. Voltages V31 and V41 that are applied respectively to photopixel electrodes 31 and storage electrodes 41 are represented by line segments labeled with the voltages.

Voltages $VS_{on}$, V31 and V41 back bias rip junctions 38 and 48 under electrodes 31 and 41 respectively in photopixels 32 and storage pixels 42. The voltages generate potential wells in photopixels 32 and storage pixels 42 in CCD 20 that are represented respectively by lines PW32 and PW42. Potential wells PW42 under storage pixel electrodes 41 are deeper than potential wells PW32 under photopixels 32. Short line segments "PB" represent a potential barrier in the boundary regions between a photopixel column 30 and an adjacent storage pixel column 40 to the left. The potential barrier operates to prevent electrons formed in the photopixel column from drifting to the left and into the left lying storage pixel column. The potential barrier is generated by dopant regions 47 noted above.

As a result of the difference in depth of potential wells PW32 and PW42 noted above, electric fields are created between a photopixel 32 and its corresponding storage pixel 42 that drive photoelectrons generated in the photopixel to the storage pixel. Photoelectrons, that are generated by light 60 incident on photopixels 32 are represented by shaded circles 50 in FIGS. 1A and 1B. Direction of drift of photoelectrons 50 under the influence of the fields generated by potential wells PW32 and PW42 is schematically indicated by block arrows 51.

The fields cause photoelectrons 50 to transfer substantially immediately upon their creation in a photopixel 32 to the photopixel's associated storage pixel 42. A time it takes photocharge to transfer from a location in the photopixel at which it is generated to the storage pixel is determined by a drift velocity of the photocharge and a distance from the location at which it is generated to the storage pixel. The drift velocity is a function of intensity of fields operating on the photoelectrons, which intensity is a function of potential difference between potential wells PW32 and PW42. For typical potential differences of a few volts and pixel pitches of less than or equal to about 100 microns, photoelectrons transfer to a storage pixel in a time that may be less than or about equal to a couple of nanoseconds or less than or about equal to a nanosecond.

Light 60 propagating towards storage pixels 42 does not create photoelectrons in the storage pixels because the light is blocked from entering the storage pixels by masking layer 44. As long as voltages $VS_{on}$, V31 and V41 are configured as discussed above and shown in FIGS. 1A and 1B. CCD interline photosurface 20 is gated on, is in an exposure period and registers light 60 that is incident on its photopixels 32. During the exposure period photoelectrons 50 generated by incident light 60 on a given photopixel 32 are continuously and rapidly transferred from the photopixel and accumulated and stored in the photopixel's associated storage pixel 42.

Figure 2A:
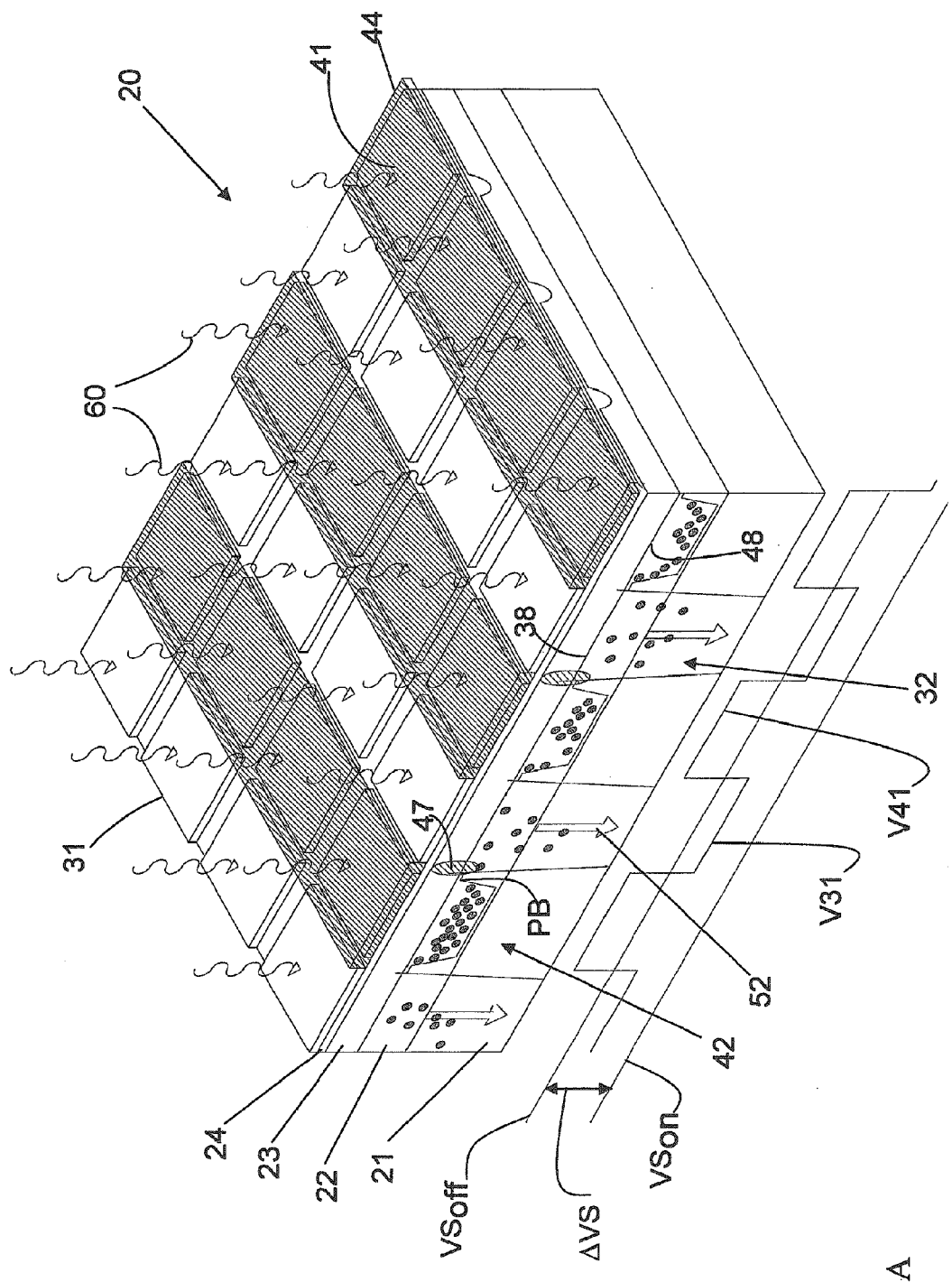

FIGS. 2A and 2B schematically show perspective and cross section views of interline CCD 20 shown in FIGS. 1A and 1B but with an OFF voltage $VS_{off}$ applied to substrate 21 and the CCD gated off, in accordance with an embodiment of the invention. OFF voltage $VS_{off}$ is represented by a line labeled $VS_{off}$ in the figures.

$VS_{off}$ is more positive than $VS_{on}$ by a difference $\Delta VS$, which is sufficient to forward bias up junctions 38 in photopixels 32 but not np junctions 48 in storage pixels 42. As a result, whereas potential wells PW42 in storage pixels 42 may be reduced in depth by the increased voltage applied to substrate 21, they remain sufficiently deep to maintain photocharge they accumulated during the time that the CCD was gated on by voltage $VS_{on}$. On the other hand, the forward biasing of np junctions 38 in photopixels 32 drains charge from the photopixels and photoelectrons generated by light 60 incident on the pixels stop moving to storage pixels 42, but are attracted to and absorbed in substrate 21. Block arrows 52 in FIGS. 2A and 2B schematically represent motion of photoelectrons 50 when CCD 20 is gated off. As long as substrate 21 is electrified to OFF voltage $VS_{off}$, CCD 20 is gated off and photoelectrons generated in photopixels 32 by light 60 are not added to storage pixels 42.

Voltage applied to substrate 21 can be changed from $VS_{off}$ to $VS_{on}$ to rapidly, electronically shutter CCD 20. In particular, the shuttering is sufficiently rapid so that CCD 20 can be electronically gated fast enough for use in a gated 3D camera to measure distances to features in a scene without having to have an additional external fast shutter. In an embodiment of the invention, the voltage to the substrate is switched between $VS_{off}$ to $VS_{on}$ to gate on the CCD for exposure periods having duration, less than or equal to 100 ns. Optionally, the exposure periods have duration less than or equal to 70 ns. In some embodiments of the invention, the exposure periods have duration less than 35 ns. In some embodiments, the exposure periods have duration less than or equal to 20 ns. In an embodiment of the invention, a time lapse between successive exposure periods is less than or equal to 400 ns and the camera is gated at a frequency greater than or equal to 2.5 MHz. Optionally, the CCD is gated at a frequency greater than or equal to 5 MHz. In some embodiments of the invention the CCD is gated at a frequency greater than or equal to 10 MHz.

By way of a numerical example, the inventors have found that it is possible to change voltage on the substrate of a Sony® ICX 098 interline CCD between $VS_{off}$ equal to about 30 volts to $VS_{on}$ equal to about 10 volts, and thereby to turn on and turn off the CCD, with a rise time less than, or about equal to 5 ns.

It is noted that change of voltage applied to a substrate of a photosurface between an ON voltage and an OFF voltage in accordance with an embodiment of the invention establishes itself throughout the substrate with sufficient uniformity and rapidity so that irising is relatively reduced.

Irising for a photosurface refers to a difference in time it takes for a signal, such as a gating signal, to propagate to and establish itself in all pixels of the photosurface. Ideally, irising should be zero, and all pixels to which a same signal is sent simultaneously should receive the signal at a same time. Generally, because signals travel at a finite velocity and photosurfaces have non-zero extent, irising is not zero. For most applications, to an extent that photosurface irising is reduced, the photosurface performs better. For a photosurface comprised in a gated 3D camera, reduced irising provides for a reduced maximum time difference, also referred to as "skew", between times at which different pixels in the photosurface are gated on or off by a same gating signal. The reduced irising improves accuracy of distance measurements provided by the 3D camera.

Figure 3:
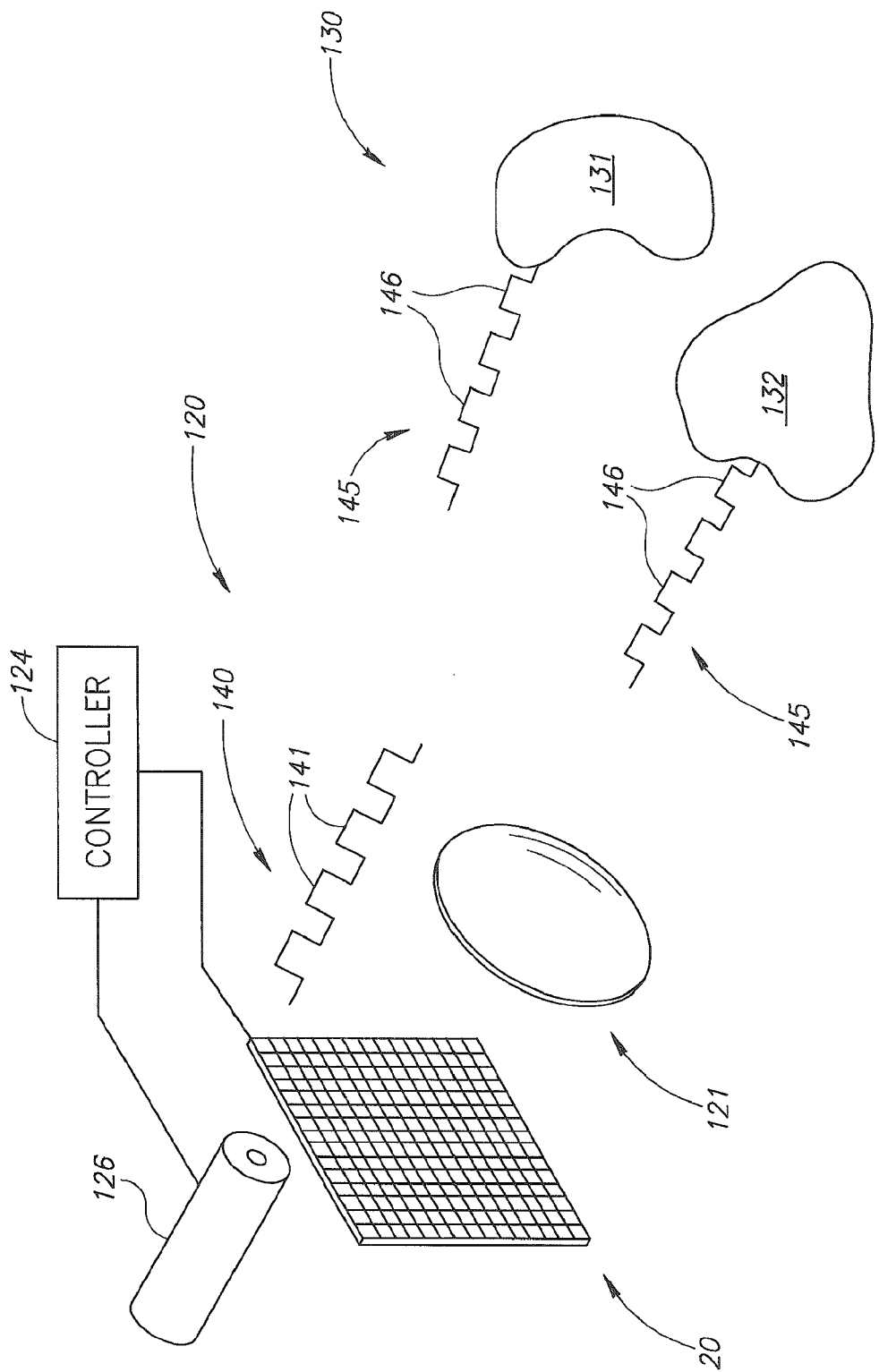
FIG. 3 schematically shows a gated 3D camera comprising the CCD photosurface shown in FIGS. 1A-2B, in accordance with an embodiment of the invention.

FIG. 3 schematically shows a gated 3D camera 120 comprising a CCD photosurface, such as interline CCD 20, being used to measure distances to a scene 130 having objects schematically represented by objects 131 and 132, in accordance with an embodiment of the invention.

Camera 120, which is represented very schematically, comprises a lens system, represented by a lens 121, and optionally an interline CCD photosurface 20 on which the lens system images the scene. Camera 120 optionally comprises a suitable light source 126, such as for example, a laser or a LED, or an array of lasers and/or LEDs, that is controllable to illuminate scene 130 with pulses of light. A controller 124 controls pulsing of light source 126 and gating of photosurface 20. Controller 124 controls photosurface 20 to be normally off by applying an OFF voltage $VS_{off}$ to substrate 21 (FIGS. 1A-2B). Timing of light pulses and gating of CCD photosurface 20 are schematically illustrated along time lines 210, 220, 230, 240 in a time line graph 200 shown in FIG. 4. All the time lines have a same, arbitrary, time scale.

To acquire a 3D image of scene 130, controller 124 controls light source 126 to emit a train of light pulses, schematically represented by a train 140 of square "light" pulses 141 having pulse width τ, to illuminate scene 130. A number of light pulses 141 from light pulse train 140 are schematically shown along time line 210 in timeline graph 200. Light pulses 141 along time line 210 are shown with pulse width τ and an overhead arrow pointing left to right to indicate that the light pulses are emitted towards scene 130.

Following a predetermined time lapse, T, after a time of emission of each light pulse 141, controller 124 turns on photosurface 20 to receive and image light from emitted light pulses 141 reflected by features in scene 130. Controller 124 turns the photosurface on, for exposure periods having duration optionally equal to light pulse width τ, by lowering voltage applied to substrate 21 by ΔVS from $VS_{off}$ to $VS_{on}$. Timing of voltage $VS_{on}$ applied to substrate 21 to turn on the photosurface relative to timing of emission of light pulses 141 is schematically shown along time line 220. Voltage $VS_{off}$ is represented by height of a line labeled $VS_{off}$ above time line 220 and voltage $VS_{on}$ is represented by height of lines labeled $VS_{on}$ above time line 220. Voltages $VS_{off}$, $VS_{on}$, ΔVS, time delay T, and exposure period duration τ are shown along the time line. Exposure periods of photosurface 20 resulting from changing voltage applied to substrate 21 between $VS_{off}$ and $VS_{on}$, are schematically indicated by hat functions 231 along time line 230. Hat functions 231 are hereinafter referred to as "exposure periods 231".

It is noted that the light pulse width, exposure period duration, and delay time T define a spatial "imaging slice" of scene 130 bounded by a minimum, lower bound distance, $D_L$, and a maximum, upper bound distance, $D_U$, from camera 120. The camera registers light reflected from the scene during exposure periods 231 only for features of the scene located between lower bound distance $D_L$ and upper bound distance $D_U$. By way of example, for exposure periods having duration equal to light pulse width τ and delay T, $D_L=c(T-τ)/2$, $D_U=c(T+τ)/2$ and the imaging slice has a thickness cτ, where c is the speed of light.

Light from each light pulse 141 reflected by features in scene 130 located in the imaging slice is incident on camera 120, collected by lens 121 and imaged on photopixels 32 of CCD 20. Light reflected by features in scene 130 from light pulses 141 is schematically represented by trains 145 of light pulses 146 in FIG. 3 for a few regions of scene 130. Amounts of light from reflected pulse trains 145 that are imaged on photopixels 32 of CCD photosurface 20 and stored in storage pixels of CCD 20 during exposure periods 231 are used to determine distances to features of scene 130 located in the imaging slice that are imaged on the photopixels. The distances are used to provide a 3D image of the scene.

Light pulses 146 from a light pulse train 145 that are reflected by a particular region of scene 130 and imaged on a corresponding photopixel 32 in CCD photosurface 20 are schematically shown along time line 240 of time line graph 200 in FIG. 4. The light pulses are shown with overhead arrows pointing right to left to indicate that the light pulses are reflected light pulse propagating back to gated 3D camera 120.

Temporal overlap of reflected light pulses 146 and exposure periods 231 are indicated by shaded regions 150 in light pulses 146 and exposure periods 231. During temporal overlap, light in light pulses 146 generate photoelectrons in the corresponding photopixel, which substantially immediately upon their generation drift to and are accumulated in storage pixel 42 (FIGS. 1A-2B) associated with the photopixel.

Following a last emitted light pulse 141 in emitted light pulse train 140, controller 124 controls CCD 20 to remain off until all storage pixels 42 in the CCD are read and a frame of the CCD acquired. Reading of the storage pixels and acquiring a frame of the CCD are schematically indicated in FIG. 4 by shaded rectangle 250 at the end of the time lines in time line graph 200.

Figure 5A:
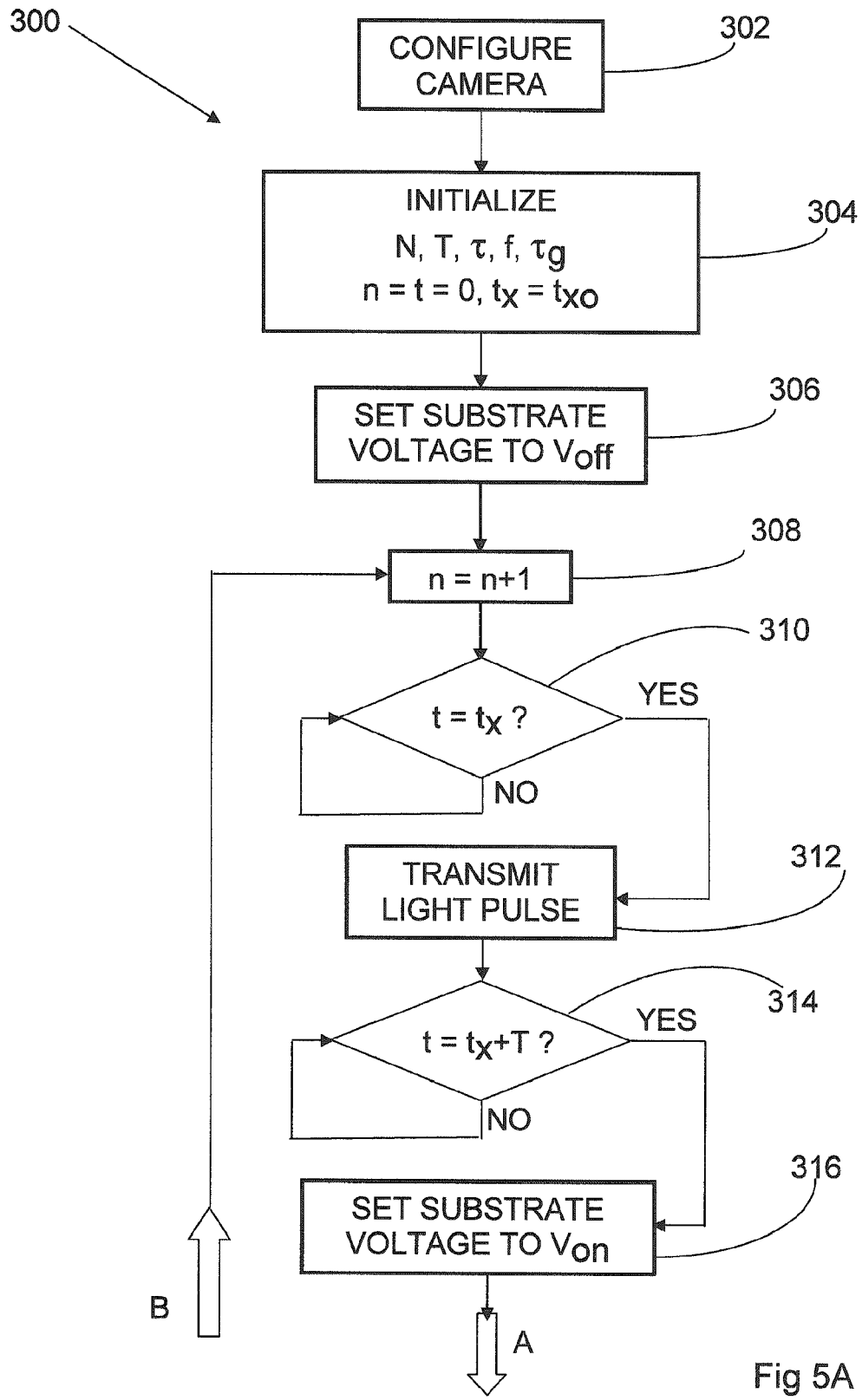
FIGS. 5A and 5B show a flow diagram of an algorithm for acquiring a 3D image of a scene using an interline CCD, in accordance with an embodiment of the invention.
Figure 5B:
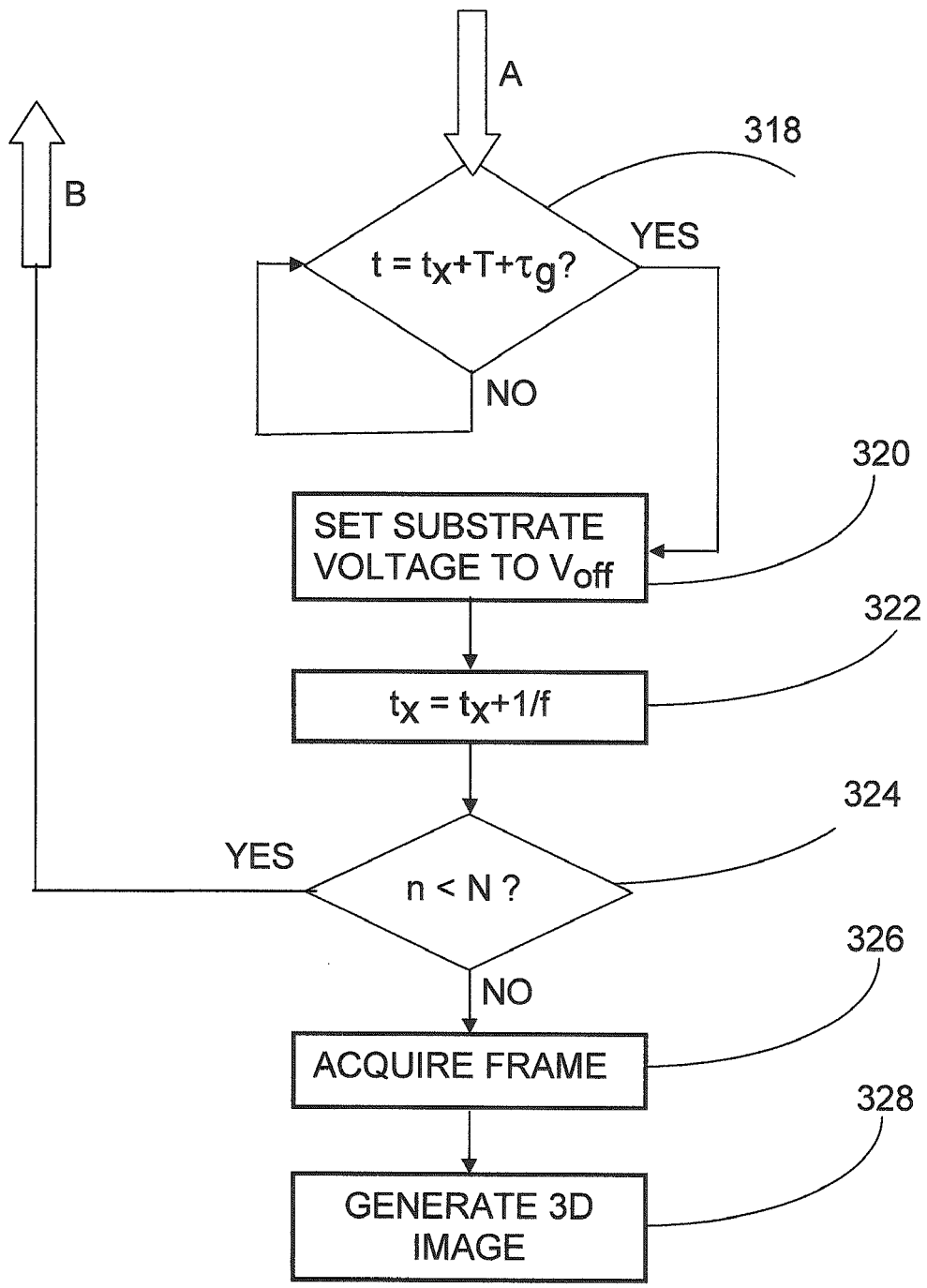

FIGS. 5A and 5B show a flow diagram of an algorithm 300 for acquiring a 3D image of a scene using a camera, such as gated 3D camera 120 shown in FIG. 3, comprising an interline CCD, in accordance with an embodiment of the invention.

In a block 302 of algorithm 300, the 3D camera is configured to image a desired imaging slice of the scene. As noted above, an imaging slice of a scene is a portion of the scene between a minimum and maximum distance from the 3D camera for which the 3D camera can determine distances. The minimum and maximum distances are determined by a pulse width of light pulses used to illuminate the scene and duration of exposure periods during which the 3D camera registers light from the scene. Thickness of the slice is a difference between the maximum and minimum distances. As noted above, for exposure periods having duration equal to the light pulse width, an imaging slice has a thickness $c\tau$, where c is the speed of light. Configuring the 3D camera generally comprises aiming, focusing and determining a depth of field for the camera to match the location, thickness, and an angular extent of the desired imaging slice.

In a block 304, operating parameters of the 3D camera that configure illuminating the scene with a train of light pulses and gating the 3D camera are initialized to match the geometry and location of the imaging slice. The operating parameters optionally comprise a number N of light pulses in the pulse train, a light pulse width $\tau$, pulse repetition frequency f, a delay time T at which the CCD is gated on following a time at which each light pulse in the pulse train is emitted, and duration of an exposure period, "$\tau_g$". Optionally, the exposure period duration $\tau_g$ equals the light pulse width $\tau$. In an embodiment of the invention, a counting index n, and time t of a system clock optionally comprised in a controller (e.g. controller 124, FIG. 3) of the 3D camera, are set to zero. A light pulse transmission time, $t_x$ is set to a time $t_{xo}$ and the system clock is turned on. The time $t_{xo}$ is a time at which a first light pulse is transmitted to illuminate the scene after the system clock is turned on.

In a block 306, in accordance with algorithm 300, the controller sets voltage to the substrate of the CCD to OFF voltage $V_{off}$ so that the CCD is off and does not accumulate photocharge generated by light from the scene that is incident on the photosurface. In a block 308, the controller increases counter index n by 1 and in a decision block 310 the controller compares clock time t to $t_x$, t is not equal to $t_x$, the controller reverts to block 310 to again compare t to $t_x$. If time $t=t_x$, in a block 312, the controller controls a light source (e.g. light source 126, FIG. 3) to transmit a first light pulse having pulse width $\tau$ to illuminate the scene. Following transmission of the light pulse, in a decision block 314, the controller compares system clock time t to $(t_x+T)$. If t is not equal to $(t+T)$ the controller reverts to decision block 314 to again compare system clock time t to $(t_x+T)$. If system clock time $t=(t_x+T)$, in a block 316, the controller applies voltage $V_{on}$ to the substrate of the CCD to gate on the CCD and accumulate photocharge generated by light from the scene in storage pixels of the CCD.

After gating the CCD on, in a block 318, the controller compares system clock time t to $(t_x+T+\tau_g)$. If t is not equal to $(t_x+T+\tau_g)$, the controller reverts to block 318 to again compare t to $(t_x+T+\tau_g)$. If $t=(t_x+T+\tau_g)$, the controller proceeds to a block 320 shown in FIG. 5B. In block 320 the controller changes voltage on the substrate of the CCD to $V_{off}$ to gate off the CCD. In a block 322, transmission time $t_x$ is increased by a time 1/f to set a time to transmit a next light pulse to illuminate the scene.

In a decision block 326 index n is compared to the total number of light pulses N that are to be transmitted to illuminate the scene. If n<N the controller returns to block 308 (FIG. 5A) to increase n by one, transmit another light pulse to illuminate the scene and cycle through blocks 310 to 324. If on the other hand, n is not less than N, a frame of the CCD is acquired in a block 326 and in a block 328, data provided by the frame is processed to provide a 3D image of the scene.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A camera comprising:
    a photosurface having a substrate comprising photopixels and associated storage pixels; and
    a controller operable to control the photosurface to image a scene by:
        applying voltage to the substrate at first and second times to respectively initiate and terminate an exposure period of the photosurface during which light from the scene is incident on the photosurface; and
        biasing the photopixels and their respective storage pixels to maintain a photocharge transfer state substantially at all times between the first and second times in which photocharge, substantially upon its generation in a photopixel, moves towards the photopixel's storage pixel.

2. The camera according to claim 1 and comprising a light source configured to transmit a train of light pulses to illuminate the scene, wherein the controller is operable to initiate and terminate an exposure period of the photosurface for each light pulse in the pulse train responsive to a time at which the light pulse is transmitted.

3. The camera according to claim 2 wherein the controller is operable to maintain the bias between the photopixels and their respective storage pixels between exposure periods substantially the same as the bias during the plurality of exposure periods.

4. The camera according to claim 2 wherein the controller is operable to acquire a frame of the photosurface after the exposure period following a last light pulse in the train of light pulses.

5. The camera according to claim 2 wherein the light source is configured to transmit light pulses in the pulse train at a repetition frequency greater than or equal to 2.5 MHz.

6. The camera according to claim 5 wherein the repetition frequency is greater than or equal to 5 MHz.

7. The camera according to claim 6 wherein the repetition frequency is greater than or equal to 10 MHz.

8. The camera according to claim 1 wherein a time lapse between the first and second times is less than 100 ns.

9. The camera according to claim 8 wherein the time lapse between the first and second times is less than 35 ns.

10. The camera according to claim 9 wherein the time lapse between the first and second times is less than 20 ns.

11. The camera according to claim 2 wherein the controller uses photocharge accumulated in a storage pixel during the exposure periods to determine a distance to a feature in the scene imaged on the photopixel associated with the storage pixel.

12. The camera according to claim 1 wherein the photosurface comprises at least one photosurface chosen from the group consisting of a CCD, a CMOS, and an interline photosurface.

* * * * *